United States Patent [19]

Ellsworth et al.

[11] Patent Number: 4,875,151

[45] Date of Patent: Oct. 17, 1989

[54] TWO TRANSISTOR FULL WAVE RECTIFIER

[75] Inventors: Daniel L. Ellsworth; Maurice M. Moll, both of Fort Collins, Colo.

[73] Assignee: NCR Corporation, Dayton, Ohio

[21] Appl. No.: 895,408

[22] Filed: Aug. 11, 1986

[51] Int. Cl.⁴ ............................................. H02M 7/217
[52] U.S. Cl. ........................................ 363/127; 357/42
[58] Field of Search ..................... 363/127; 357/42, 41; 307/296 R, 127

[56]         References Cited
         U.S. PATENT DOCUMENTS

| | | | |
|---|---|---|---|
| 3,458,798 | 7/1969 | Fang et al. | 363/127 |
| 3,955,210 | 5/1976 | Bhatia et al. | 357/42 |
| 4,039,869 | 8/1977 | Goldman et al. | 357/42 X |
| 4,139,880 | 2/1979 | Ulmer et al. | 307/127 |
| 4,276,592 | 6/1981 | Goldman et al. | 357/41 X |
| 4,303,958 | 12/1981 | Allgood | 357/42 X |
| 4,476,476 | 10/1984 | Yu et al. | 357/42 X |
| 4,559,548 | 12/1985 | Iizuka et al. | 357/42 X |
| 4,777,580 | 10/1988 | Bingham | 363/127 |

FOREIGN PATENT DOCUMENTS 0052860  6/1982  European Pat. Off. .

OTHER PUBLICATIONS

Maleis, US Statutory Invention Registration (H64), 5/6/86.

Primary Examiner—Patrick R. Salce
Assistant Examiner—Kristine Peckman
Attorney, Agent, or Firm—Wilbert Hawk, Jr.; Casimer K. Salys

[57]                ABSTRACT

An integrated circuit two transistor full wave rectifier suitable for fabrication in a CMOS, NMOS or PMOS process and characterized by a high level of integration based upon shared utilization of doped regions. In one form, the full wave rectifier is configured from two diode connected field effect transistors and two parasitic p-n junctions, all formed in a substrate region of common impurity type.

12 Claims, 2 Drawing Sheets

TWO TRANSISTOR FULL WAVE RECTIFIER

BRIEF SUMMARY

This invention relates to integrated circuit type electronic devices and more particularly to the implementation of a full wave rectifier using two field effect transistors and selective substrate contacts.

According to a preferred embodiment, the two field effect transistors (FETs) are formed in a commonly doped region of a substrate, the FETs share a source/drain region which is connected to one side of the load, and the FETs use a substrate contact for connecting to the other side of the load. The remaining two source/drain regions of each transistor are connected to their respective gate electrodes, which commonly formed nodes are then individually connected to the two sides of an AC voltage source.

The two transistor configuration provides a full wave rectified output which can, with a supplemental capacitive filtering and voltage regulation, serve as a DC power source for integrated circuit devices. The present rectifier circuit is particularly useful for circuit applications where all functions are to be integrated on a common chip fabricated with CMOS field effect transistors operated by DC voltage yet powered from an AC source. A representative and preferred application would be one in which the power is transmitted to the chip from an electrical source by electromagnetic or capacitive coupling. Exemplary applications include pacemakers and "smart " credit cards or electronic keys.

These and other beneficial uses of the invention and its practice will be more clearly understood and appreciated upon considering the detailed description which follows.

DETAILED DESCRIPTION

The prevalence of integrated circuit devices fabricated with CMOS technology has provided the opportunity to develop products which can perform relatively complex electronic functions yet operate with minimum power requirements. Similarly, the present trend is away from using electrochemical power sources, batteries, and toward system product designs which are powered by energy transmitted without wires, e.g., solar power calculators. In view of the low power requirements of many new integrated circuit designs, it is now also feasible to electromagnetically or capacitively couple, through an intervening dielectric, sufficient energy to power an integrated circuit chip for time coincident operation or extended operation where the coupled energy is stored by capacitive or rechargeable electrochemical means. One specific example might be a pacemaker which is recharged daily by electromagnetic coupling, while another might be a "smart " credit card or electronic key which is powered by insertion into a mechanism which electromagnetically couples both power and data to and from the chip, thereby substantially negating the problems associated with electrical contacts. Consequently, there exists the need for an electronic circuit which can be fabricated on a CMOS chip and can efficiently convert AC energy to the DC form suitable for time coincident use or extended storage.

The present two field effect transistor implementation of a full wave rectifier provides the requisite features, in that the structure involves the use of a standard integrated circuit arrangement of minimal complexity, can be configured to avoid latchup parasitic bipolar transistors often encountered in CMOS circuits, can be implemented using either a p-well or n-well CMOS fabrication processes, does not unduly dissipate power under normal operating conditions, and can be readily interconnected to other integrated circuit elements to provide filtering or regulation of the rectified DC voltage.

These features are in contrast to designs such as that disclosed in U.S. Pat. No. 4,276,592, which reference teaches an implementation for a rectifier which is half wave and requires a current limiting, power consuming, resistor to avoid short circuit conditions. A design which is functionally more similar, but structurally distinguishable, is described in recently published U.S. Statutory Invention Registration No. H64. That particular structural arrangement requires electrical isolation of the implementing field effect transistors, by placement in separate wells, and the use of numerous, physically dispursed diffusions and contacts to establish the necessary p-n junction rectification.

Figure 1:
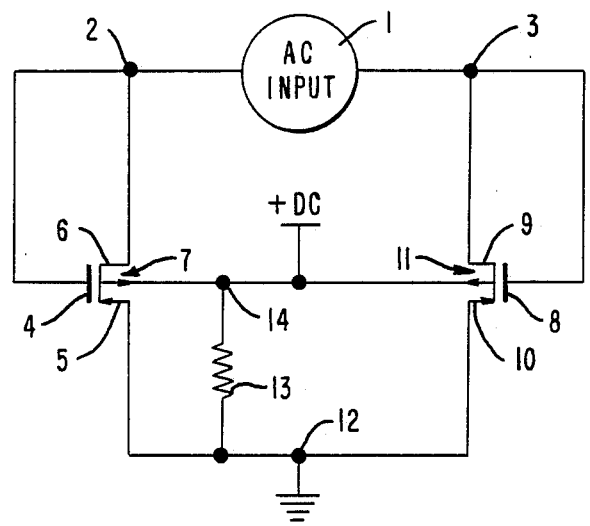
FIG. 1 is a schematic of a p-channel embodiment of the invention.

One preferred embodiment of the present invention is depicted schematically in FIG. 1 of the drawings. A cross section of a p-well CMOS integrated circuit implementation of the schematic is depicted in FIG. 2 of the drawings, retaining for purposes of clarity schematic representations of the electrical connections, AC input, and equivalent DC load.

Referring to FIG. 1, AC power is furnished by AC input voltage supply 1 at nodes 2 and 3, which nodes are respectively connected to gate electrode 4 and drain electrode 6 of p-channel field effect transistor 7, and connected to gate electrode 8 and drain electrode 9 of p-channel field effect transistor 11. Both field effect transistors are enhancement type devices. The source electrodes, 5 and 10 (doped region 18 in FIG. 2), of respective transistors 7 and 11 are commonly connected to node 12, which node is connected to ground potential and also serves as one connection to equivalent resistive load 13. The other side of the equivalent resistive load 13 is connected to the node 14, the substrate (doped contact regions 19 and 21 in FIG. 2)

The presence of an AC voltage between nodes 2 and 3 produces a plus DC voltage having a full wave rectified waveform on node 14 with respect to ground node 12. The shape of DC voltage on node 14 is influenced by the shape of the AC input, the threshold voltages of transistor 7 and 11, including any back bias effects on these transistors, and a diode voltage drop. Distributed capacitance filtering effects are also present. For example, the DC voltage on node 14 can range from a slightly clipped full wave rectified sinusoidal pattern to a near DC level for a square wave AC input.

Figure 2:
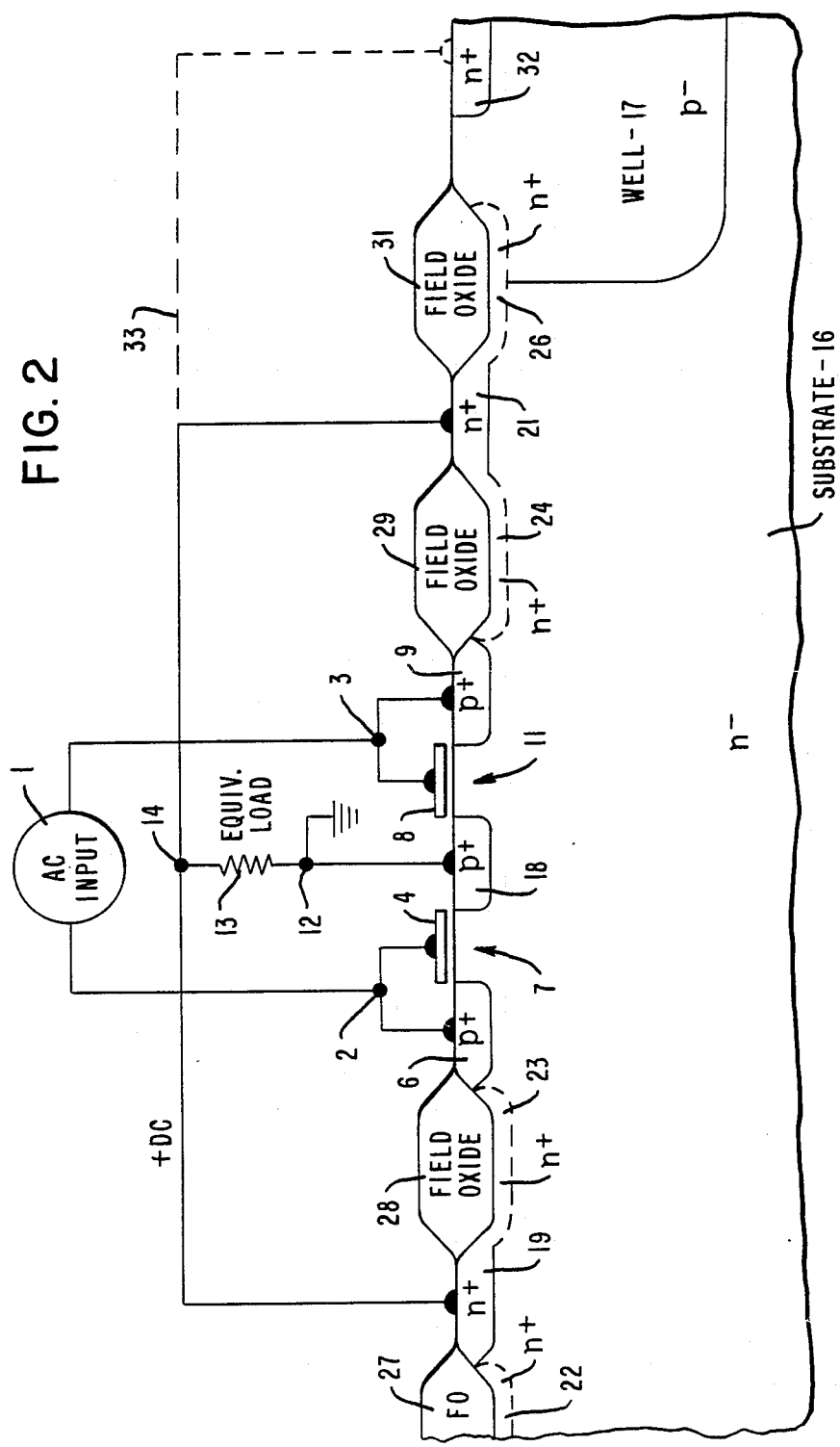
FIG. 2 is a diagram schematically depicting a cross section of a representative p-channel embodiment interconnected to provide full wave rectification.

FIG. 2 illustrates by way of schematic cross section a preferred embodiment of the invention in the context of a p-well CMOS integrated circuit. This embodiment should not be construed as a limitation, in that the invention is fully subject to practice in devices fabricated with an n-well CMOS processes as well as with individual NMOS or PMOS fabrication processes. Likewise, the configuration is amenable to epitaxial structures in lieu of wells. However, in all cases care must be exercised to avoid structures which are susceptible to latch-up.

The embodiment depicted in FIG. 2 is formed in an n− substrate 16, and includes an optional well 17 of p− impurity. As shown, the structure is comprised of p-channel field effect transistors 7 and 11, individually responsive to respective gate electrodes 4 and 8 situated between p+ source/drain regions 6, 9 and 18, the latter being shared by both transistors. The shared source/drain region 18 is connected to ground node 12 and one side of equivalent load 13. Source/drain region 6 of transistor 7 is connected in common with gate electrode 4 to node 2, which node itself is connected to one side of AC input 1. Similarly, source/drain region 9 is connected in common with gate electrode 8 of transistor 11 to node 3, which node is connected to the other side of AC input 1. The plus DC voltage appears on node 14, which is connected to the other side of equivalent load 13 and to n+ diffusions 19 and 21 in substrate 16. The use of multiple n+ diffusions, in contrast to the minimum requirement of a single substrate surface contact, as well as the creation of n+ channel stops 22, 23, 24 and 26 under a field oxide regions 27, 28, 29 and 31, implements known carrier trapping techniques in view of the charge injected into substrate 16. Charge is injected into substrate 16 when the p-n junctions 6 to 16 or 9 to 16 are forward biased. Note further that layout density and charge injection benefits may accrue by deleting field oxide regions 28 and 29, so as to place p+ diffusions 6 and 9 into immediate contact with respective n+ contact diffusions 19 and 21, forming the requisite diode therebetween.

To understand the operation of the circuit as structurally depicted in FIG. 2 consider a situation in which AC input 1 is a sinusodial voltage source, having peak values of +7 and −7 volts, and field effect transistors 7 and 11 have nominal threshold voltages of −0.9 volts. During that instant of time when AC input 1 is generating a voltage of +7 volts at node 3 with respect to node 2, the junction between p+ region 9 and composite substrate 16/n+ contact region 21 is positively biased, providing the +7 volts less the p-n junction diode drop to node 14 of equivalent load 13. The other side of equivalent load 13 is connected to AC input 1 through field effect transistor 7, which is conductively biased whenever the instantaneous AC input voltage is greater than the combination of the p-n drop and the threshold voltage of transistor 7, approximately 1.6 volts. The end effect is that load 13 experiences a rectified voltage having a 5.4 volt peak. When the AC input voltage reverses, conventional current conduction is from node 2, through p+ region 6, to n+ region 19 (and 21), through load 13, to node 12, and through forward biased field effect transistor 11 to node 3.

Unfiltered full wave rectified DC voltage is in most cases unacceptable for operating an integrated circuit. However, when the power demands are minimal, such as is common for many CMOS integrated circuits, on-chip capacitive filtering is feasible. With limited power demands, sufficient filtering can often be obtained from the parasitic capacitive effects of n-channel device diffusions in p-wells. If such distributed capacitance proves to be inadequate for effective filtering, it is also feasible to add capacitive structures. For instance, in the context of FIG. 2, there is shown the possibility of forming a junction capacitor between n+ region 32 and p-well 17, which can then be connected by line 33 to filter the DC voltage on node 14. As is no doubt understood, though equivalent load 13 represents functional electronic devices on the same substrate 16, it may, if the occasion arises, include elements external to the integrated circuit chip represented by substrate 16.

Consideration of the circuit and structure depicted in FIG. 2 will disclose the presence of a number of unique features. First, although the structure is preferably used in conjunction with a CMOS integrated circuit, the underlying concepts are similarly applicable to NMOS and PMOS processed devices. Secondly, the circuit depicted in FIG. 2 does not have local latch-up susceptibility, in that a parasitic bipolar transistor structure is not created. The absence of latch-up susceptibility is valid for p-channel devices formed in an n-type substrate, or in the complementary n-well fabrication process, when n-channel transistors are formed in a p-type substrate. Any attempt to place p-channel transistors in an n-well of a p-type substrate, or an attempt to place n-channel transistors in a p-well of an n-type substrate will create a parasitic vertical bipolar transistor structure susceptible to latch-up.

Figure 3:
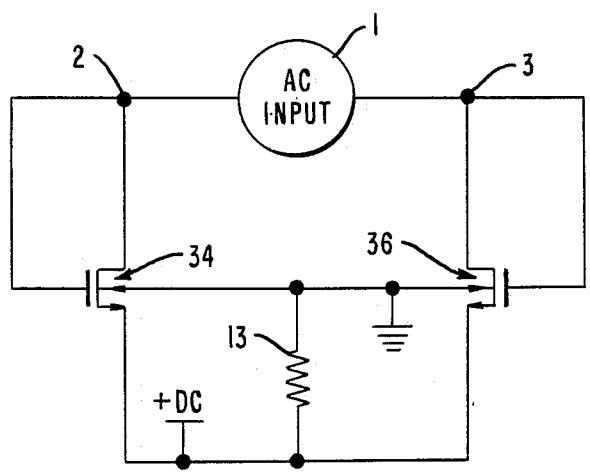
FIG. 3 is a schematic of an n-channel embodiment of the invention.

The complement to the circuit schematically depicted in FIG. 1, and shown by way of cross section in FIG. 2, is schematically depicted in FIG. 3. As depicted, AC input 1 at nodes 2 and 3 drives n-channel transistors 34 and 36 to provide a full wave rectified DC voltage across load 13, the load voltage polarity now being opposite that previously generated with respect to the substrate. Again, field effect transistors 34 and 36 are enhancement mode types, here preferably configured to have a threshold voltage of approximately +0.7 volts. The cross sectional schematic depicted in FIG. 2 would be equally applicable to the arrangement in FIG. 3, with an interchange of the impurity types for the various regions and a reversal of the ground and DC voltage connections to equivalent load 13.

The establishment of the threshold voltages for p-channel transistors such as 7 and 11 in FIG. 2 must take into account the back bias effects associated with the injection of charge into substrate 16 from diffusions 6 and 9. Note that in the case of the n-channel transistor design schematically depicted in FIG. 3 the substrate is at ground and back bias effects are absent.

We claim:
1. A two transistor full wave rectifier, comprising:
   first and second field effect transistors of first conductivity type, each resident in a substrate region of second conductivity type and each having respective first and second electrode regions and a gate electrode;
   a first node, defining a common connection of a DC load terminal, the first electrode region of the first field effect transistor and the first electrode region of the second field effect transistor;
   a second node, defining a common connection of the second electrode region of the first field effect transistor, the gate electrode of the first field effect transistor and the first of two connections to a source of AC voltage;
   a third node, defining a common connection of the second electrode region of the second field effect transistor, the gate electrode of the second field effect transistor and the second of the two connections to the source of AC voltage; and a fourth node, defining a common connection of the other DC load terminal and the second conductivity type substrate region of each resident field effect transistor.

2. The apparatus as recited in claim 1, wherein the first electrode region of the first field effect transistor and the first electrode region of the second field effect transistor are defined by a single region of first conductivity type.

3. The apparatus recited in claim 2, wherein the first and second field effect transistors are enhancement type devices.

4. The apparatus recited in claim 3, wherein the second conductivity type substrate region of each resident field effect transistor is a single ohmically continuous region of second conductivity type.

5. The apparatus recited in claim 4, wherein the single ohmically continuous region includes multiple heavily doped contact regions for carrier trapping.

6. The apparatus recited in claim 2, further including in a separate well of first conductivity type a region of second conductivity type connected to the load and providing capacitive filtering therein.

7. A two transistor full wave rectifier, comprising:
first and second p-channel field effect transistors each having a gate electrode and source and drain regions fabricated in an n-type substrate;
a first node, defining a common connection of a DC load terminal and a source region of each p-channel field effect transistor with ground potential;
a second node, defining a common connection of the gate electrode and the drain region of the first p-channel field effect transistor with the first of two connections to a source of AC voltage;
a third node, defining a common connection of the gate electrode and the drain region of the second p-channel field effect transistor with the second of the two connections to the source of AC voltage; and
a fourth node, defining a common connection of the other DC load terminal to the n-type substrate.

8. The apparatus recited in claim 7, wherein the first and second p-channel field effect transistors are enhancement type devices when back biased.

9. The apparatus recited in claim 8, wherein source regions of the first node are comprised of a single p-type region in the substrate.

10. A two transistor full wave rectifier, comprising:
first and second n-channel field effect transistors each having a gate electrode and source and drain regions fabricated in a p-type substrate;
a first node, defining a common connection of a DC load terminal with a source region of each n-channel field effect transistor;
a second node, defining a common connection of the gate electrode and the drain region of the first n-channel field effect transistor with the first of two connections to the source of AC voltage;
a third node, defining a common connection of the gate electrode and the drain region of the second n-channel field effect transistor with the second of the two connections to the source of AC voltage; and
a fourth node, defining a common connection of the other DC load terminal and the n-type substrate with ground potential.

11. The apparatus recited in claim 10, wherein the first and second n-channel field effect transistors are enhancement type devices.

12. The apparatus recited in claim 11, wherein the source regions of the first node are comprised of a single n-type region in the substrate.

* * * * *